(12) United States Patent
Zhu et al.

(10) Patent No.: US 10,347,530 B2
(45) Date of Patent: Jul. 9, 2019

(54) METHOD OF FORMING INTERCONNECT STRUCTURE WITH PARTIAL COPPER PLATING

(71) Applicants: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

(72) Inventors: Ji Guang Zhu, Shanghai (CN); Hai Ting Li, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 0 days.

(21) Appl. No.: 15/816,973

(22) Filed: Nov. 17, 2017

(65) Prior Publication Data
US 2018/0151426 A1    May 31, 2018

(30) Foreign Application Priority Data
Nov. 25, 2016    (CN) .......................... 2016 1 1054718

(51) Int. Cl.
*H01L 21/768*    (2006.01)
*H01L 23/532*    (2006.01)
(Continued)

(52) U.S. Cl.
CPC .... *H01L 21/76879* (2013.01); *H01L 21/2885* (2013.01); *H01L 21/3212* (2013.01);
(Continued)

(58) Field of Classification Search
CPC ............ H01L 21/0272; H01L 21/2885; H01L 21/32105; H01L 21/32115; H01L 21/3212;
(Continued)

(56) References Cited

U.S. PATENT DOCUMENTS 6,140,234 A * 10/2000 Uzoh ................ H01L 21/76807
257/E21.579
6,162,728 A    12/2000 Tsao et al.
(Continued)

FOREIGN PATENT DOCUMENTS

EP    1020905    7/2000
JP    2011258839    12/2011

OTHER PUBLICATIONS

European Patent Application No. 17202999.3, Extended European Search Report dated Apr. 19, 2018, 7 pages.

*Primary Examiner* — Stephen W Smoot
(74) *Attorney, Agent, or Firm* — Anova Law Group, PLLC

(57) ABSTRACT

A method for manufacturing an interconnect structure includes providing a substrate structure including a substrate and a dielectric layer on the substrate, the dielectric layer having an opening extending to the substrate. The method further includes forming a mask layer on at least one portion of the dielectric layer, forming a metal layer filling the opening and covering portions of dielectric layer not covered by the mask layer, removing the mask layer, and planarizing the metal layer so that an upper surface of a remaining portion of the metal layer is flush with an upper surface of the dielectric layer. The method can mitigate the warping problems of the substrate associated with the fabrication of the interconnect structure.

14 Claims, 3 Drawing Sheets

(51) Int. Cl.
*H01L 21/321* (2006.01)
*H01L 21/288* (2006.01)
*H01L 23/528* (2006.01)

(52) U.S. Cl.
CPC .... *H01L 21/32115* (2013.01); *H01L 21/7684* (2013.01); *H01L 21/7688* (2013.01); *H01L 21/76807* (2013.01); *H01L 21/76846* (2013.01); *H01L 21/76873* (2013.01); *H01L 21/76877* (2013.01); *H01L 23/5283* (2013.01); *H01L 23/53228* (2013.01); *H01L 23/53238* (2013.01)

(58) Field of Classification Search
CPC ......... H01L 21/76807; H01L 21/76819; H01L 21/7684; H01L 21/76846; H01L 21/76865; H01L 21/76873; H01L 21/76877; H01L 21/76879; H01L 21/7688; H01L 21/76883; H01L 23/5283; H01L 23/53228; H01L 23/53238; H01L 2221/1015; H01L 2221/1073
See application file for complete search history.

(56) References Cited

U.S. PATENT DOCUMENTS

| | | | | |
|---|---|---|---|---|
| 6,346,454 B1 * | 2/2002 | Sung | ................ | H01L 21/76807 257/E21.011 |
| 9,779,989 B1 * | 10/2017 | Huang | .............. | H01L 21/76873 |
| 2015/0108602 A1 * | 4/2015 | Choi | .................. | H01L 23/5256 257/529 |

* cited by examiner

METHOD OF FORMING INTERCONNECT STRUCTURE WITH PARTIAL COPPER PLATING

CROSS-REFERENCES TO RELATED APPLICATIONS

The present application claims priority to Chinese patent application No. 201611054718.4, filed with the State Intellectual Property Office of People's Republic of China on Nov. 25, 2016, the content of which is incorporated herein by reference in its entirety.

FIELD OF THE INVENTION

The present invention relates to semiconductor technology, and more particularly to a method for manufacturing an interconnect structure.

BACKGROUND OF THE INVENTION

For reducing device feature sizes, current techniques generally employ the Damascene process for forming an interconnect structure. A conventional process of manufacturing an interconnect structure may include the steps of first forming an opening in a dielectric layer on a substrate, and then depositing a barrier layer and a seed layer on the surface of the dielectric layer and on the surface of the opening. Thereafter, the process may also include depositing a metal layer filling the opening and covering the seed layer disposed on the dielectric layer, and then planarizing the deposited metal layer.

BRIEF SUMMARY OF THE INVENTION

The present inventors have discovered that a substrate is susceptible to warping when an interconnect structure is manufactured by the conventional manufacturing methods, and the substrate warping may affect the reliability of the interconnect structure. The present inventors provide a novel solution for solving the warping problems of a substrate when manufacturing an interconnect structure therein.

Embodiments of the present invention provide a method for manufacturing an interconnect structure. The method includes providing a substrate structure including a substrate and a dielectric layer on the substrate, the dielectric layer has an opening extending to the substrate. The method also includes forming a mask layer on at least one portion of the dielectric layer, forming a metal layer filling the opening and covering portions of the dielectric layer not covered by the mask layer, removing the mask layer, and planarizing the metal layer so that an upper surface of a remaining portion of the metal layer is flush with an upper surface of the dielectric layer.

In one embodiment, the dielectric layer includes a first region and a second region spaced apart from each other, the first region having a surface area smaller than a surface area of the second region, and forming the mask layer on the at least one portion of the dielectric layer includes forming the mask layer on a portion of the second region.

In one embodiment, the method further includes, prior to forming the mask layer, forming a barrier layer on the substrate structure, and the mask layer is formed on the barrier layer. In one embodiment, the method also includes, prior to forming the mask layer, forming a seed layer on the barrier layer, and the mask layer is formed on the seed layer.

In one embodiment, forming the metal layer includes an electro-chemical plating process.

In one embodiment, the mask layer includes photoresist. The metal layer comprises copper.

In one embodiment, planarizing the metal layer includes a chemical mechanical polishing process.

In one embodiment, the opening includes a single damascene structure. In one embodiment, the opening includes a dual damascene structure.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
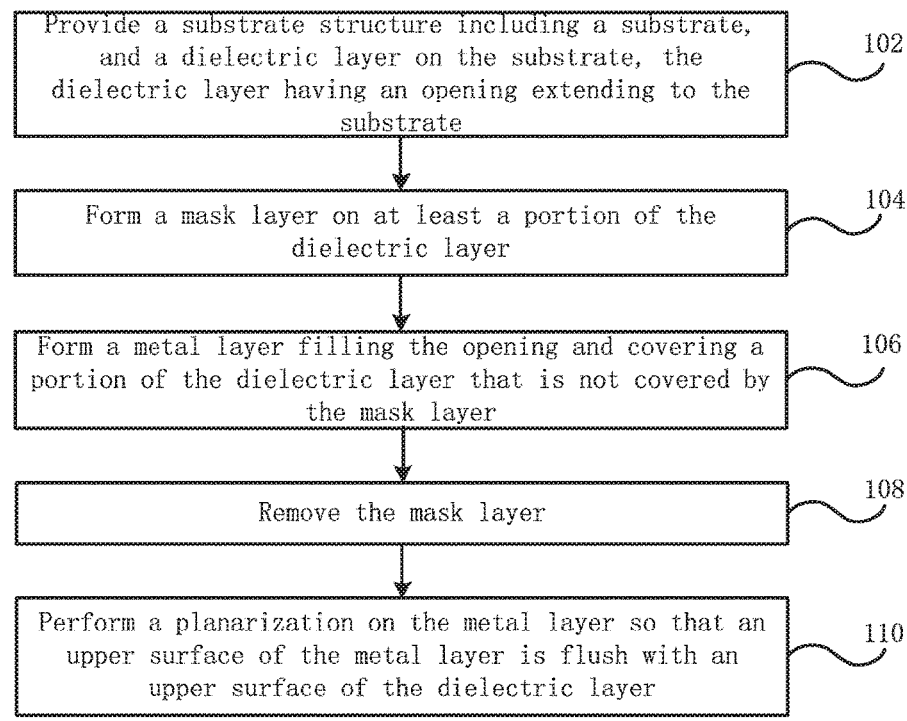
FIG. 1 is a simplified flowchart of a method for manufacturing an interconnect structure according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. In the drawings, like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "Lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and the are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

It should be noted that like reference numerals are used to denote like elements, and once an element has been defined in a drawings, it will not be further described in other drawings.

Embodiments of the present invention now will be described more fully hereinafter with reference to the accompanying drawings, in which embodiments of the invention are shown. This invention may, however, be embodied in many different forms and should not be construed as limited to the embodiments set forth herein.

The present inventors have studied the problems of substrate warping and found that the metal layer is formed in a blanket deposition on the entire substrate in conventional manufacturing processes, however, for processes that require a very thick layer of metal, an integrated passive device (IPD) process requires a deposition of a metal layer having a thickness of about 5 microns, the deposited metal will have a large stress that may cause warping of the substrate and generate gaps in the metal formed in the opening, thereby affecting the reliability of the interconnect structure. Accordingly, the present inventors propose a new method that does not require the metal layer to be formed on the entire surface of the substrate, but rather some portions on the surface of the substrate are blocked, that way will reduce the amount of the metal layer formed on the substrate, thereby reducing the stress on the deposited metal layer, reducing the problem of substrate warping, and improving the reliability of the interconnect structure.

FIG. 1 is a simplified flowchart of a method for manufacturing an interconnect structure according to an embodiment of the present invention. FIGS. 2 to 6 are cross-sectional views illustrating intermediate stages of an interconnect structure in a manufacturing method according to an embodiment of the present invention. A method for manufacturing an interconnect structure according to an embodiment of the present invention will be described below with reference to FIGS. 1 and 2 to 6.

Figure 2:
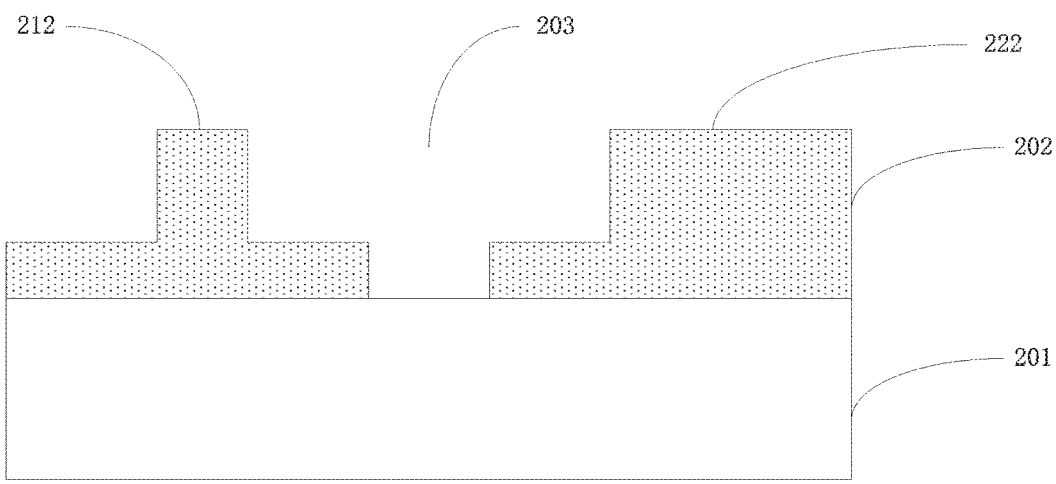
FIGS. 2 to 6 are cross-sectional views illustrating intermediate stages of an interconnect structure in a manufacturing method according to an embodiment of the present invention.

Referring to FIG. 1, a substrate structure is provided at step 102. Referring to FIG. 2, the substrate structure may include a substrate 201 and a dielectric layer 202 on substrate 201. Dielectric layer 202 includes an opening 203 extending to substrate 201. Substrate 201 may include different devices, such as metal oxide semiconductor (MOS) devices, passive devices, etc. Substrate 201 may include a semiconductor layer (e.g., silicon, germanium, gallium arsenide, and the like) and a device layer on the semiconductor layer. In one embodiment, opening 203 may include an opening of a single damascene structure. In another embodiment, opening 203 may include an opening of a dual damascene structure. FIG. 2 schematically shows opening 203 of a dual damascene structure including a trench extending into dielectric layer 202 and a via below the trench and extending to substrate 201. In some embodiments, the via may include two or more through holes.

It should be noted that opening 203 can be formed using conventional damascene processes that are compatible with existing semiconductor fabrication processes and will not be described herein for the sake of brevity.

Figure 3:
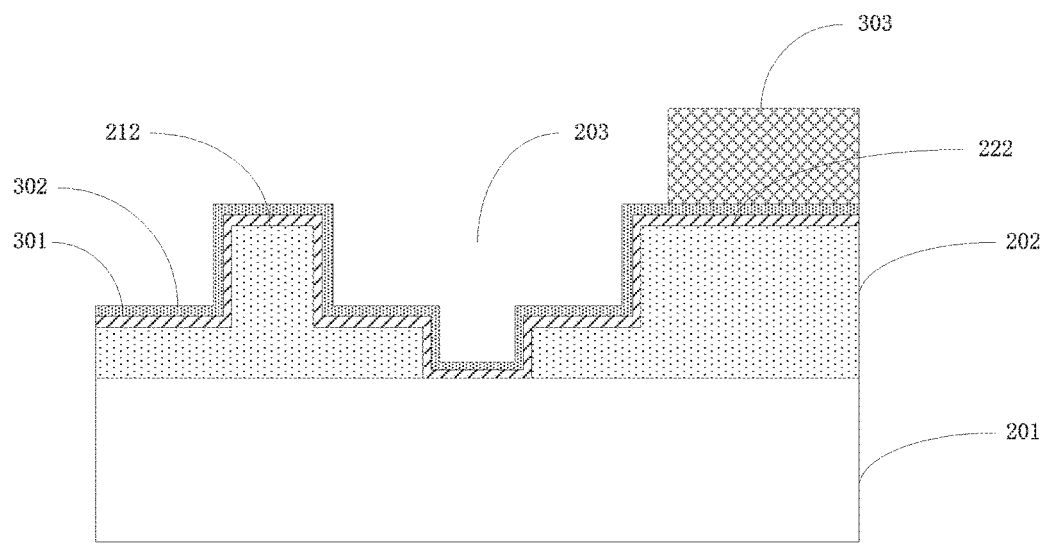

Next, at step 104, referring to FIG. 3, a mask layer 303 is formed on at least one portion of dielectric layer 202. Herein, mask layer 303 may be formed on a portion of dielectric layer 202, or mask layer 303 may be formed on the entire surface of dielectric layer 202. In one embodiment, mask layer 303 may include, but not limited to, a photoresist.

In one embodiment, referring to FIG. 3, dielectric layer 202 may include a first region 212 and a second region 222 that are spaced apart from each other, the surface area of first region 212 is smaller than the surface area of second region 222. In this case, mask layer 303 may be formed only on a portion of second region 222. It will be appreciated that dielectric layer 202 may include a plurality of regions having different surface areas. In some embodiments, mask layer 303 may be formed only on regions of dielectric layer 202 having a relatively large surface areas, i.e., mask layer 303 may not be formed on regions of dielectric layer 202 having relatively small surface areas. As used herein, a relatively small surface area is defined as a surface area that is 10% to 50% smaller than a relatively large surface area.

In one embodiment, referring to FIG. 3, prior to forming mask layer 303 on at least one portion of dielectric layer 202, a barrier layer 301 may be formed (e.g., by deposition) on the substrate structure shown in FIG. 2, so that mask layer 303 is formed on barrier layer 301. In one embodiment, barrier layer 301 may include TaN, Ta, or a stack layer of TaN and Ta. In one embodiment, a seed layer 302 may be formed on barrier layer 301 prior to forming mask layer 303 on at least one portion of dielectric layer 202, so that mask layer 303 is formed on seed layer 302. Seed layer 302 may include copper. In one embodiment, barrier layer 301 and seed layer 302 each may be formed using a physical vapor deposition (PVD) process.

Figure 4:
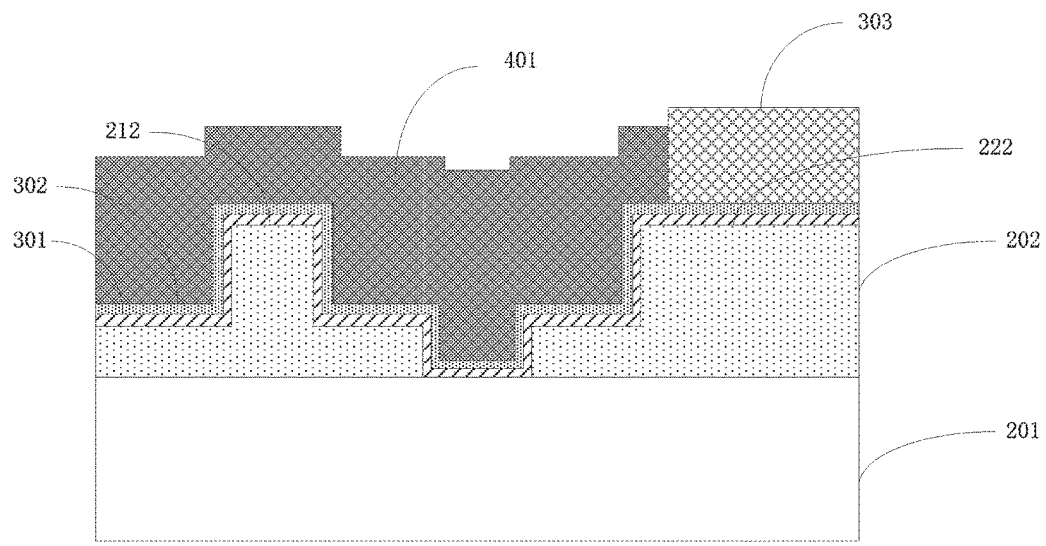

Next, at step 106, a metal layer 401 is formed (e.g., by deposition) filling opening 203 and disposed on portions of dielectric layer that are not covered by mask layer 303, as shown in FIG. 4. For example, if mask layer 303 is formed on the entire surface of dielectric layer 202, then dielectric layer 202 does not have a portion that is not covered by mask layer, that is, metal layer 401 only fills opening 203. For example, metal layer 401 may be deposited using an electro-chemical plating (ECP) process. In one embodiment, metal layer 401 may include copper. Since mask layer 303 covers at least one portion of the dielectric layer, the surface area of that covered portion of the dielectric layer is relatively large, so that the amount of deposited metal layer 401 is substantially reduced compared to the amount of a conventional blanket-deposited metal layer, thereby reducing the stress in the subsequently formed interconnect structure and improving the reliability of the interconnect structure.

Figure 5:
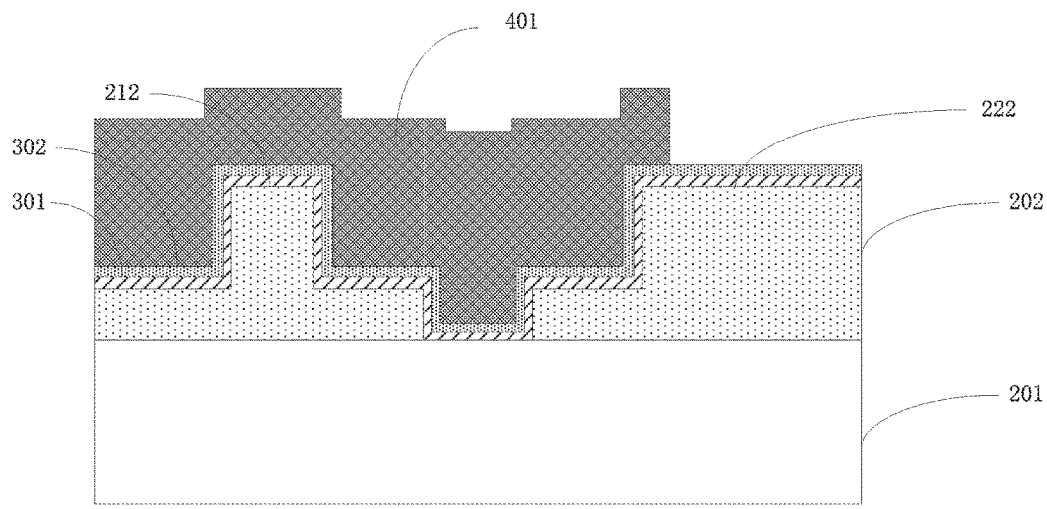

Next, at 108, mask layer 303 is removed, as shown in FIG. 5. Mask layer 303 may be removed, for example, using a stripping process.

Figure 6:
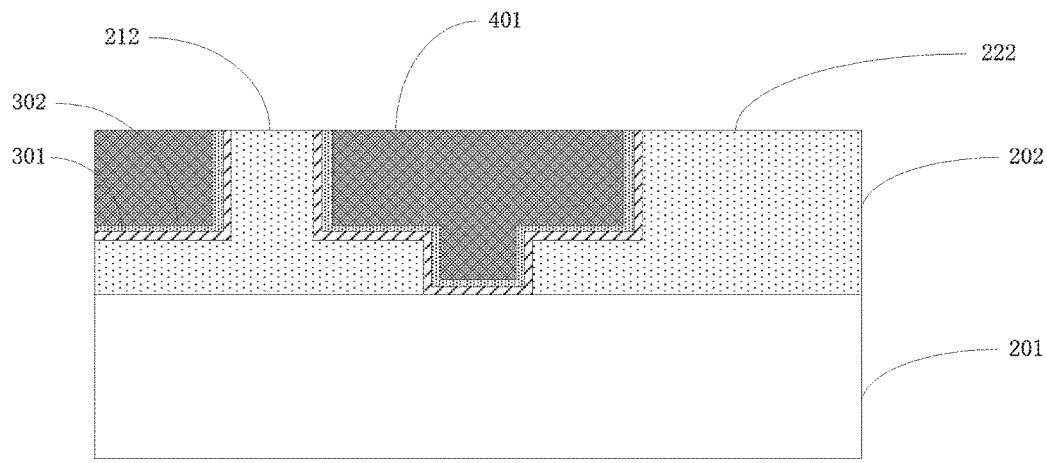

Next, at 110, a planarization process, e.g., a chemical mechanical polishing (CMP) process, may be performed on metal layer 401 until the upper surface of a remaining metal layer is substantially flush with the upper surface of dielectric layer 202, as shown in FIG. 6. Herein, in the case where barrier layer 301 and seed layer 302 are formed on dielectric layer 202, the planarization process can also remove the portion of seed layer and the portion of the barrier layer on the upper surface portion of the dielectric layer at the same time.

In accordance with the present invention, in the method of manufacturing an interconnect structure, a mask layer is formed on at least one portion of the dielectric layer to reduce the amount of a subsequently deposited metal layer, the stress in the metal layer is thus reduced, and the warping problem of the substrate is solved, thereby improving the reliability and stability of the interconnect structure. Further, the method of the present invention provides the advantages that there is no metal layer deposition on the regions of the dielectric layer that are covered by the mask layer, which facilitates the planarization process and mitigates the planarization issues associated with a warped substrate.

The manufacturing method of the present invention is particularly well suited for forming a relatively thick metal layer when filling the opening of an interconnect structure.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing an interconnect structure, the method comprising:
    providing a substrate structure including a substrate and a dielectric layer on the substrate, the dielectric layer having an opening extending to the substrate, the dielectric layer including a first region and a second region, spaced apart from each other by the opening, the second region having a topmost surface area greater than the first region;
    forming a mask layer only on at least one portion of the topmost surface area of the second region of the dielectric layer;
    forming a metal layer filling the opening and covering portions of the dielectric layer uncovered by the mask layer;
    removing the mask layer; and
    planarizing the metal layer so that an upper surface of a remaining metal layer is flush with an upper surface of the dielectric layer.

2. The method of claim 1, further comprising,
    prior to forming the mask layer, forming a barrier layer on the substrate structure, the mask layer being formed on the barrier layer.

3. The method of claim 2, further comprising,
    prior to forming the mask layer, forming a seed layer on the barrier layer, the mask layer being formed on the seed layer.

4. The method of claim 1, wherein forming the metal layer comprises an electro-chemical plating process.

5. The method of claim 1, wherein the mask layer comprises a photoresist.

6. The method of claim 1, wherein the metal layer comprises copper.

7. The method of claim 1, wherein the planarizing comprises a chemical mechanical polishing process.

8. The method of claim 1, wherein the opening comprises a single damascene structure.

9. The method of claim 8, wherein all surface portions of the dielectric layer are uncovered by the mask layer in the single damascene structure of the opening.

10. The method of claim 1, wherein the opening comprises a dual damascene structure.

11. The method of claim 10, wherein the dual damascene structure includes a trench extending into the dielectric layer and a via under the trench and extending to substrate.

12. The method of claim 11, wherein the via includes two or more through holes.

13. The method of claim 11, wherein the opening includes an additional damascene structure and exposes a plurality of surface areas of the dielectric layer that is substantially in parallel with the topmost surface area and uncovered by the mask layer.

14. The method of claim 13, wherein an overlapped area between the mask layer and the at least one portion of the second region in a direction perpendicular to the topmost surface area is greater than any of the plurality of surface areas of the dielectric layer in the opening.

* * * * *